United States Patent
Tomiyama

[19]

[11] Patent Number: 6,064,255
[45] Date of Patent: May 16, 2000

[54] PULSE COUNTING FM DEMODULATOR

[75] Inventor: Hitoshi Tomiyama, Kanagawa, Japan

[73] Assignee: Sony Corporation, Tokyo, Japan

[21] Appl. No.: 09/152,970

[22] Filed: Sep. 14, 1998

Related U.S. Application Data

[62] Division of application No. 08/790,114, Jan. 29, 1997, Pat. No. 5,913,155.

[30] Foreign Application Priority Data

Feb. 14, 1996 [JP] Japan ............................. P08-051036
Jul. 19, 1996 [JP] Japan ............................. P08-190951

[51] Int. Cl.$^7$ ............................. H03D 3/00; H03K 9/06
[52] U.S. Cl. ......................... 329/341; 329/342; 455/214
[58] Field of Search .................................. 329/341, 342, 329/343; 455/214

[56] References Cited

U.S. PATENT DOCUMENTS 4,282,490  8/1981  Kusakabe ................................. 329/342

*Primary Examiner*—Siegfried H. Grimm
*Attorney, Agent, or Firm*—Jay H. Maioli

[57] ABSTRACT

A pulse counting FM demodulator includes a differentiating circuit that differentiates an FM intermediate-frequency signal to produce a differentiated pulse signal. A trigger signal is generated based on the differentiated pulse signal and is used to control the charging and discharging of a capacitor that is included in a monostable multivibrator. The charging and discharging of the capacitor provides an output level inverting operation. A variable current source supplies the capacitor with a charging current that is varied in response to an externally supplied control voltage, and an output circuit provides a demodulated output signal having a level corresponding to the output level inverting operation in the monostable multivibrator.

5 Claims, 5 Drawing Sheets

PULSE COUNTING FM DEMODULATOR

This is a division of prior application Ser. No. 08/790,114 filed Jan. 29, 1997 and now U.S. Pat. No. 5,913,155.

BACKGROUND OF THE INVENTION

1. Field of the Invention

The present invention relates to broadcasting signal receiving apparatus and pulse counting demodulators, and is directed to an improvement in a broadcasting signal receiving apparatus for receiving selectively frequency-modulated and amplitude-modulated broadcasting signals to obtain reproduced information outputs and further to an improved pulse counting demodulator suitable for use to demodulate a frequency-modulated information signal received by the broadcasting signal receiving apparatus.

2. Description of the Prior Art

In the field of super heterodyne receivers used for receiving frequency-modulated or amplitude-modulated broadcasting signals transmitted from radio broadcasting stations, there has been generally known to employ a digital tuning system wherein, for example, a phase-locked loop (PLL) is utilized in place of an analog tuning system wherein a variable capacitor is used. In the super heterodyne receiver in which the digital tuning system is employed, the phase-locked loop works under the control of a microcomputer to carry out rapid and exact tuning operation and manual adjustments by a user are not necessary so that a tuning portion easy to use is constituted.

The super heterodyne receiver employing the digital tuning system excels in an automatic scanning tuning operation which is convenient for use. Under a condition in which the automatic scanning tuning operation is performed, a receiving frequency provided for receiving selectively frequency-modulated or amplitude-modulated broadcasting signals is successively changed at predetermined regular frequency intervals by the phase-locked loop working under the control of the microcomputer. Then, when there is a frequency-modulated or amplitude-modulated broadcasting signal which corresponds with the receiving frequency, the change in the receiving frequency is temporarily ceased to keep the frequency-modulated or amplitude-modulated broadcasting signal therewith. Such detection of the frequency-modulated or amplitude-modulated broadcasting signal is indicated by an indicator lamp or the like and reproduced information outputs in the form of, for example, audio outputs are obtained from the frequency-modulated or amplitude-modulated broadcasting signal tuning with the receiving frequency are automatically produced.

In such an automatic scanning tuning operation, each of the receiving frequencies obtained successively at predetermined regular frequency intervals corresponds to a carrier frequency of each of frequency-modulated or amplitude-modulated broadcasting signals transmitted from broadcasting stations, respectively. In the case of radio broadcasting signals in Japan, carrier frequencies of frequency-modulated broadcasting signals are arranged at intervals of 100 kHz within a frequency band, for example, from 76 MHz to 90 MHz, which is called an FM band, and carrier frequencies of amplitude-modulated broadcasting signals are arranged at intervals of 9 kHz within a frequency band, for example, from 531 kHz to 1602 kHz, which is called an AM band. Accordingly, the receiving frequency provided for receiving selectively the frequency-modulated broadcasting signals is successively changed to correspond to each of the carrier frequencies arranged at intervals of 100 kHz within the FM band from 76 MHz to 90 MHz and the receiving frequency provided for receiving selectively the amplitude-modulated broadcasting signals is successively changed to correspond to each of the carrier frequencies arranged at intervals of 9 kHz within the AM band from 531 kHz to 1602 kHz.

When the automatic scanning tuning operation is performed in the super heterodyne receiver employing the digital tuning system, it is feared that an erroneous detection in which the frequency-modulated or amplitude-modulated broadcasting signal from a certain broadcasting station which is different from a desirous broadcasting station is undesirably detected is raised. Especially, in the case of the amplitude-modulated radio broadcasting signals, since the frequency interval between each two adjacent carrier frequencies is relatively narrow such as to be, for example, 9 kHz, it is easy to arise that the amplitude-modulated radio broadcasting signal having one of two adjacent carrier frequencies is undesirably detected in place of the amplitude-modulated radio broadcasting signal having the other of two adjacent carrier frequencies which is desired to be detected.

For example, in the case where the receiving frequency is successively changed to increase step by step and correspond to each of the carrier frequencies of the amplitude-modulated radio broadcasting signals under a condition wherein there is a radio broadcasting station transmitting an amplitude-modulated radio broadcasting signal having a carrier frequency of 999 kHz and relatively large signal strength, it is feared that a reception output obtained based on the amplitude-modulated radio broadcasting signal having the carrier frequency of 999 kHz, which is received when the receiving frequency is changed to be 990 kHz, becomes so large that the amplitude-modulated radio broadcasting signal having the carrier frequency of 999 kHz is erroneously detected and as a result the receiving frequency is not changed to reach 999 kHz but caused to keep 990 kHz, so that the automatic scanning tuning operation is ceased.

With intent to avoid the fears mentioned above, there has been previously proposed a system in which, whenever the amplitude-modulated radio broadcasting signal is received with the receiving frequency changed successively to correspond to each of the carrier frequencies of the amplitude-modulated radio broadcasting signals by the phase-locked loop working under the control of the microcomputer, an amplitude-modulated intermediate frequency signal which is obtained by frequency-converting the received amplitude-modulated radio broadcasting signal is supplied to the microcomputer by which the phase-locked loop is controlled and in which the carrier frequency of the amplitude-modulated intermediate frequency signal is detected and it is checked, on the basis of the detected carrier frequency, whether the received amplitude-modulated radio broadcasting signal is desired. The detection of the carrier frequency of the amplitude-modulated intermediate frequency signal in the microcomputer is carried out by counting pulses obtained based on a carrier signal component contained in the amplitude-modulated intermediate frequency signal.

In the case where the pulses obtained based on the carrier signal component contained in the amplitude-modulated intermediate frequency signal are counted in the microcomputer as described above, the amplitude-modulated intermediate frequency signal is subjected to waveform shaping to be shaped into a rectangular waveform signal for obtaining the pulses based on the carrier signal component. This waveform shaping on the amplitude-modulated intermediate frequency signal brings a disadvantage that higher harmonic signals including a signal having a frequency, for example, two or three times higher than the carrier frequency of the amplitude-modulated intermediate frequency signal are produced. The higher harmonic signals thus produced result in such a problem that each of the higher harmonic signals acts on a receiving end for the amplitude-modulated broadcasting signals, such as a receiving antenna coil or the like, as a spurious signal operative to obstruct the amplitude-modulated broadcasting signal from being appropriately received through the receiving end.

For example, when the carrier frequency of the amplitude-modulated intermediate frequency signal is set to be 450 kHz, the higher harmonic signal having a frequency of, for example, 900 kHz (double) or 1350 kHz (three times) results from the waveform shaping to which the amplitude-modulated intermediate frequency signal is subjected to be shaped into the rectangular waveform signal. The higher harmonic signal thus produced with the frequency of 900 kHz or 1350 kHz acts on the receiving end to obstruct the amplitude-modulated broadcasting signal having the carrier frequency of, for example, 900 kHz or 1350 kHz from being appropriately received through the receiving end.

OBJECTS AND SUMMARY OF THE INVENTION

Accordingly, it is an object of the present invention to provide a broadcasting signal receiving apparatus for receiving selectively frequency-modulated and amplitude-modulated broadcasting signals to obtain reproduced information outputs from a received frequency-modulated or amplitude-modulated broadcasting signal, which avoids the aforementioned difficulties encountered with the prior art.

Another object of the present invention is to provide a broadcasting signal receiving apparatus for receiving selectively frequency-modulated and amplitude-modulated broadcasting signals to obtain reproduced information outputs from a received frequency-modulated or amplitude-modulated broadcasting signal, in which it can be adequately checked whether a carrier frequency of the received amplitude-modulated broadcasting signal is desired when the amplitude-modulated broadcasting signals are selectively received, without bringing a disadvantageous situation in which a higher harmonic signal produced through waveform shaping to which an amplitude-modulated intermediate frequency signal obtained by frequency-converting the received amplitude-modulated broadcasting signal is subjected acts as a spurious signal operative to obstruct the amplitude-modulated broadcasting signal from being appropriately received.

A further object of the present invention is to provide a broadcasting signal receiving apparatus for receiving selectively frequency-modulated and amplitude-modulated broadcasting signals to obtain reproduced information outputs from a received frequency-modulated or amplitude-modulated broadcasting signal, in which it can be adequately checked whether a carrier frequency of the received amplitude-modulated broadcasting signal is desired when the amplitude-modulated broadcasting signals are selectively received, without bringing a disadvantageous situation in which a higher harmonic signal produced through waveform shaping to which an amplitude-modulated intermediate frequency signal obtained by frequency-converting the received amplitude-modulated broadcasting signal is subjected acts as a spurious signal operative to obstruct the amplitude-modulated broadcasting signal from being appropriately received, and the selective reception of the amplitude-modulated broadcasting signals can be appropriately controlled on the basis of the checking result.

A still further object of the present invention is to provide a pulse counting demodulator which is suitable to frequency-demodulate a frequency-modulated intermediate frequency signal obtained by frequency-converting a frequency-modulated broadcasting signal received by a broadcasting signal receiving apparatus according to the present invention.

According to the present invention, there is provided a broadcasting signal receiving apparatus comprising a first signal receiving portion operative to receive selectively frequency-modulated broadcasting signals and to obtain a frequency-modulated intermediate frequency signal based on a received frequency-modulated broadcasting signal, a first band pass filter for causing the frequency-modulated intermediate frequency signal to pass therethrough, a first demodulating portion operative to frequency-demodulate the frequency-modulated intermediate frequency signal derived from the first band pass filter to obtain a first demodulation output signal, a second signal receiving portion operative to receive selectively amplitude-modulated broadcasting signals and to obtain an amplitude-modulated intermediate frequency signal based on a received amplitude-modulated broadcasting signal, a second band pass filter for causing the amplitude-modulated intermediate frequency signal to pass therethrough, a second demodulating portion operative to amplitude-demodulate the amplitude-modulated intermediate frequency signal derived from the second band pass filter to obtain a second demodulation output signal, an output portion for obtaining a reproduced information output based on the first demodulation output signal or the second demodulation output signal, a signal supplying portion operative to supply the first demodulating portion with the amplitude-modulated intermediate frequency signal derived from the second band pass filter when the reproduced information output based on the second demodulation output signal can be obtained from the output portion, and an operation control portion operative to use a demodulation output signal obtained from the first demodulating portion under a condition in which the amplitude-modulated intermediate frequency signal derived from the second band pass filter is supplied to the first demodulating portion by the signal supplying portion for controlling selective reception of the amplitude-modulated broadcasting signals in the second signal receiving portion.

An embodiment of broadcasting signal receiving apparatus according to the present invention comprises a control signal producing portion operative to supply the first demodulating portion with a control signal for adjusting a frequency-demodulation characteristic in the first demodulating portion and to supply further the second band pass filter with a control signal for adjusting a frequency band selection characteristic in the second band pass filter, in addition to the first signal receiving portion, first band pass filter, first demodulating portion, second signal receiving portion, second band pass filter, second demodulating portion, output portion, signal supplying portion and operation control portion.

Further, according to the present invention, there is provided also a pulse counting demodulator comprising an input differentiating portion operative to differentiate an input frequency-modulated signal to produce a differentiated pulse signal based on the input frequency-modulated signal, a monostable multivibrator comprising a capacitive element and operative to conduct an output level inverting operation with charge and discharge on the capacitive element in response to a trigger signal which is supplied to the monostable multivibrator in response to the differentiated pulse signal obtained from the input differentiating portion, a variable current source portion operative to supply the capacitive element with a charging current and to vary the charging current in response to a control voltage supplied from the outside, and an output portion for obtaining a demodulation output signal having a level corresponding to the output level inverting operation in the monostable multivibrator.

In the broadcasting signal receiving apparatus constituted as described above in accordance with the present invention, a first signal receiving condition in which the frequency-modulated broadcasting signals are selectively received and the reproduced information output based on the received frequency-modulated broadcasting signal is obtained from the output portion and a second signal receiving condition in which the amplitude-modulated broadcasting signals are selectively received and the reproduced information output based on the received amplitude-modulated broadcasting signal is obtained from the output portion are selectively set. Under the second signal receiving condition, the amplitude-modulated intermediate frequency signal derived from the second band pass filter is supplied to the first demodulating portion by the signal supplying portion and therefore the demodulation output signal based on the amplitude-modulated intermediate frequency signal is obtained from the first demodulating portion. This demodulation output signal corresponds to a carrier frequency of the amplitude-modulated intermediate frequency signal because the first demodulating portion is operative essentially to frequency-demodulate a frequency-modulated signal supplied thereto. Then, the demodulation output signal obtained based on the amplitude-modulated intermediate frequency signal from the first demodulating portion is used for controlling the selective reception of the amplitude-modulated broadcasting signals in the second signal receiving portion by the operation control portion.

When the amplitude-modulated broadcasting signal received by the second signal receiving portion does not have a desirous carrier frequency, that is, erroneous detection is raised, the demodulation output signal obtained from the first demodulating portion based on the amplitude-modulated intermediate frequency signal which is obtained with a improper carrier frequency from the second signal receiving portion is used for controlling the selective reception of the amplitude-modulated broadcasting signals in the second signal receiving portion.

In the control to the selective reception of the amplitude-modulated broadcasting signals in the second signal receiving portion by the operation control portion, it is checked, on the basis of the demodulation output signal obtained based on the amplitude-modulated intermediate frequency signal from the first demodulating portion, whether the carrier frequency of the amplitude-modulated broadcasting signal received by the second signal receiving portion is desired, and the reception of the amplitude-modulated broadcasting signal at that time is maintained in the second signal receiving portion when it is clarified that the carrier frequency of the amplitude-modulated broadcasting signal received by the second signal receiving portion is desirous and the reception of the amplitude-modulated broadcasting signal at that time is ceased so as to cause another amplitude-modulated broadcasting signal to be received in the second signal receiving portion when it is clarified that the carrier frequency of the amplitude-modulated broadcasting signal received by the second signal receiving portion is not desirous.

Accordingly, with the broadcasting signal receiving apparatus according to the present invention, it can be adequately checked whether the carrier frequency of the received amplitude-modulated broadcasting signal is desired when the amplitude-modulated broadcasting signals are selectively received, without bringing a disadvantageous situation in which, for example, a higher harmonic signal produced through waveform shaping to which the amplitude-modulated intermediate frequency signal is subjected acts as a spurious signal operative to obstruct the amplitude-modulated broadcasting signal from being appropriately received, and the selective reception of the amplitude-modulated broadcasting signals can be appropriately controlled on the basis of the checking result.

In the embodiment of broadcasting signal receiving apparatus according to the present invention, the control signal producing portion is provided and the frequency-demodulation characteristic in the first demodulating portion and the frequency band selection characteristic in the second band pass filter are adjusted respectively by the control signals supplied from the control signal producing portion. With the adjustments by the control signals supplied from the control signal producing portion, each of the frequency-demodulation characteristic in the first demodulating portion and the frequency band selection characteristic in the second band pass filter is caused to coincide with a predetermined desirable characteristic when it has deviated from the predetermined desirable characteristic due to, for example, dispersion in characteristic of each circuit element, such as a semiconductor element or the like, constituting various portions of the embodiment. Accordingly, under a condition in which the first demodulating portion, the second band pass filter and the control signal producing portion are incorporated, together with other portions, into an integrated circuit device, each of the frequency-demodulation characteristic in the first demodulating portion and the frequency band selection characteristic in the second band pass filter can be easily and adequately adjusted through a control signal adjusting portion which is connected to the control signal producing portion and provided on the outside of the integrated circuit device.

The pulse counting demodulator according to the present invention is suitable for constituting the above mentioned first demodulating portion of the broadcasting signal receiving apparatus according to the present invention. With this pulse counting demodulator, the frequency-modulated intermediate frequency signal produced in the above mentioned broadcasting signal receiving apparatus according to the present invention can be adequately frequency-demodulated, and in addition, when the amplitude-modulated intermediate frequency signal produced in the above mentioned broadcasting signal receiving apparatus according to the present invention is supplied, the demodulation output signal corresponding to the carrier frequency of the amplitude-modulated intermediate frequency signal, namely, the demodulation output signal corresponding to the carrier frequency of the amplitude-modulated intermediate frequency signal received selectively by the second signal receiving portion, can be surely obtained without bringing a disadvantageous situation in which, for example, a higher harmonic signal produced through waveform shaping to which the amplitude-modulated intermediate frequency signal is subjected acts as a spurious signal operative to obstruct the amplitude-modulated broadcasting signal from being appropriately received.

Further, in the pulse counting demodulator according to the present invention, since the variable current source portion which is operative to supply the capacitive element contained in the monostable multivibrator with the charging current and to vary the charging current in response to the control voltage supplied from the outside is provided, the frequency-demodulation characteristic including a demodulation center frequency, sensitivity of demodulation and so on can be easily and adequately adjusted with the control voltage supplied from the outside.

The above, and other objects, features and advantages of the present invention will become apparent from the following detailed description taken in conjunction with the accompanying drawings.

DESCRIPTION OF THE PREFERRED EMBODIMENTS

Figure 1:
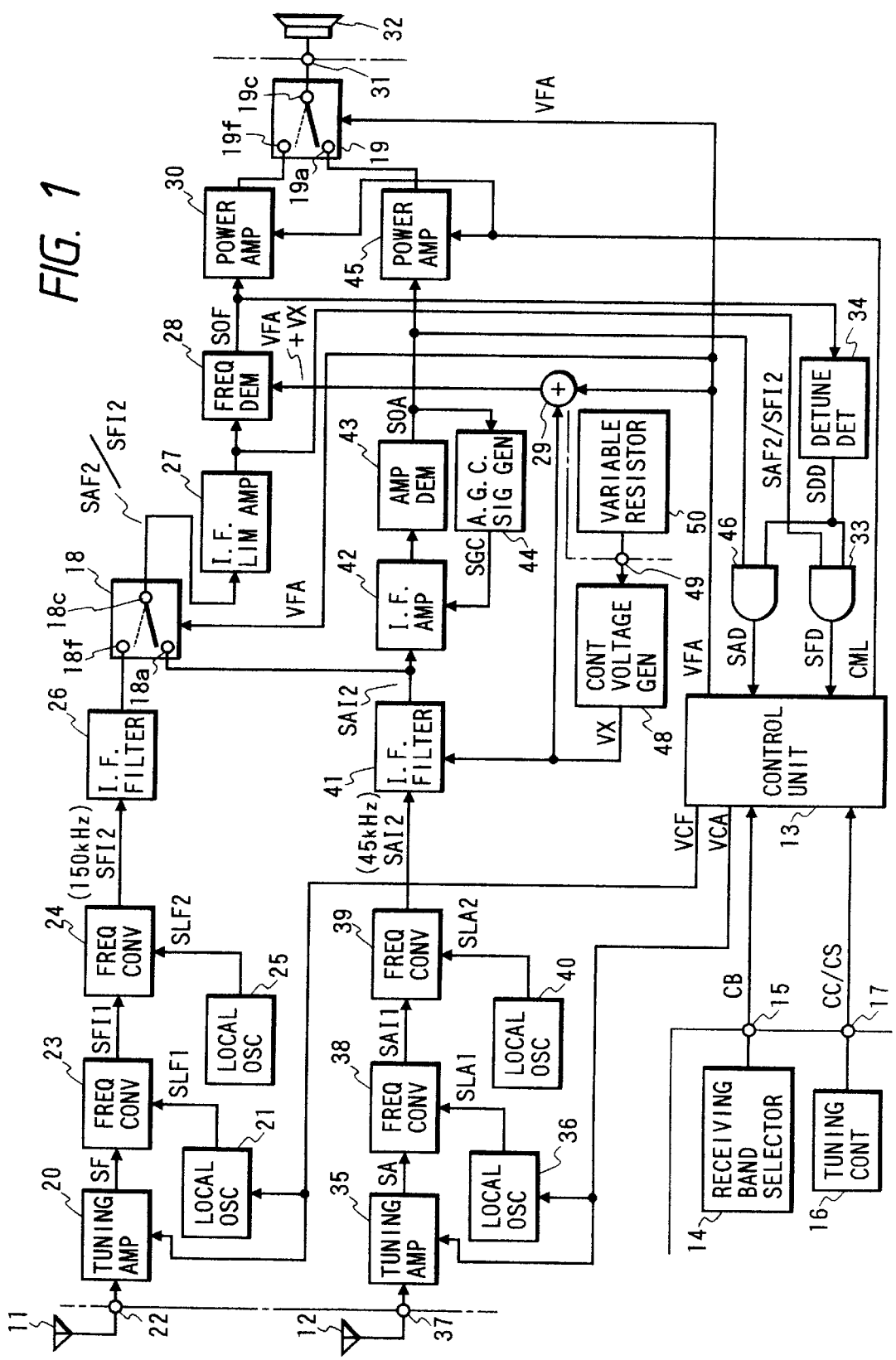
FIG. 1 is a block diagram showing an embodiment of broadcasting signal receiving apparatus according to the present invention.

FIG. 1 shows an embodiment of a broadcasting signal receiving apparatus according to the present invention.

Referring to FIG. 1, an antenna 11 for receiving frequency-modulated broadcasting signals from a plurality of radio broadcasting stations, each of which has a carrier frequency residing in, for example, a frequency band from 76 MHz to 90 MHz, and an antenna 12 for receiving amplitude-modulated broadcasting signals from a plurality of radio broadcasting stations, each of which has a carrier frequency residing in, for example, a frequency band from 531 kHz to 1602 kHz, are provided. With these antennas 11 and 12, a frequency-modulated signal receiving condition in which the frequency-modulated broadcasting signals are selectively received and an amplitude-modulated signal receiving condition in which the amplitude-modulated broadcasting signals are selectively received are selectively set.

Each of the frequency-modulated signal receiving condition and the amplitude-modulating signal receiving condition is set by a control unit 13 which is provided for forming an operation control portion. A command signal CB for making a request for a frequency-modulated broadcasting signal band or an amplitude-modulated broadcasting signal band is supplied through a control terminal 15 to the control unit 13 from a receiving band selector 14. A command signal CS for making a request for an automatic scanning tuning operation or a command signal CC for making a request for a tuning operation for tuning one of the frequency-modulated and amplitude-modulated broadcasting signals is also supplied through a control terminal 17 to the control unit 13 from a tuning controller 16.

When the command signal CB from the receiving band selector 14 is supplied through the control terminal 15 to the control unit 13 for requesting the frequency-modulated broadcasting signal band, a control voltage signal VFA having, for example, a high level for setting the frequency-modulated signal receiving condition is derived from the control unit 13 in response to the command signal CB. With the control voltage signal VFA having the high level, a switch 18 is controlled to cause a movable contact 18c to be connected with a selective contact 18f, as shown with a broken line, and a switch 19 is controlled to cause a movable contact 19c to be connected with a selective contact 19f, as shown with a broken line, so that the frequency-modulated signal receiving condition is set in the broadcasting signal receiving apparatus shown in FIG. 1.

Under the frequency-modulated signal receiving condition thus set in the apparatus shown in FIG. 1, when the command signal CS requesting the automatic scanning tuning operation or the command signal CC requesting the tuning operation for tuning one of the frequency-modulated broadcasting signals is supplied through the control terminal 17 to the control unit 13 from the tuning controller 16, a tuning control voltage signal VCF is supplied from the control unit 13 to a tuning amplifier 20 and a local oscillator 21. Thereby, a tuning frequency is provided to correspond to the tuning control voltage signal VCF in the tuning amplifier 20 and an oscillation frequency is provided to correspond to the tuning control voltage signal VCF in the local oscillator 21.

When the tuning frequency provided in the tuning amplifier 20 comes to a frequency substantially coincident with or extremely adjacent to the carrier frequency of one of the frequency-modulated broadcasting signals arriving upon the antenna 11 from the respective radio broadcasting stations, the said frequency-modulated broadcasting signal is received through an antenna terminal 22 by the tuning amplifier 20. The frequency-modulated broadcasting signal thus received is amplified by the tuning amplifier 20 to be a received frequency-modulated broadcasting signal SF supplied to a frequency convertor 23. An oscillation output signal SLF1 from the local oscillator 21 oscillating at the oscillation frequency corresponding to the tuning control voltage signal VCF is also supplied to the frequency convertor 23.

In the frequency convertor 23, the received frequency-modulated broadcasting signal SF is frequency-converted in accordance with the oscillation output signal SLF1 to produce a frequency-modulated intermediate frequency signal SFI1. The frequency-modulated intermediate frequency signal SFI1 has a carrier frequency corresponding to the difference between the carrier frequency of the received frequency-modulated broadcasting signal SF and the frequency of the oscillation output signal SLF1, which is set to be, for example, 10.7 MHz. The frequency-modulated intermediate frequency signal SFI1 is further supplied to a frequency convertor 24. An oscillation output signal SLF2 from a local oscillator 25 oscillating at a predetermined constant oscillation frequency is also supplied to the frequency convertor 24.

In the frequency convertor 24, the frequency-modulated intermediate frequency signal SF1 is further frequency-converted in accordance with the oscillation output signal SLF2 to produce a frequency-modulated intermediate frequency signal SFI2. The frequency-modulated intermediate frequency signal SFI2 has a carrier frequency corresponding to the difference between the carrier frequency of the frequency-modulated intermediate frequency signal SFI2 and the frequency of the oscillation output signal SLF2, which is set to be, for example, 150 kHz. The frequency-modulated intermediate frequency signal SFI2 having the carrier frequency of, for example, 150 kHz and obtained from the frequency convertor 24 is supplied to an intermediate frequency band pass filter (I.F. filter) 26.

A circuit portion including the above mentioned tuning amplifier 20, local oscillators 21 and 25 and frequency convertors 23 and 24 constitutes a frequency-modulated broadcasting signal receiving portion which is operative to receive selectively frequency-modulated broadcasting signals and to obtain a frequency-modulated intermediate frequency signal based on a received frequency-modulated broadcasting signal.

The frequency-modulated intermediate frequency signal SFI2 having passed through the intermediate frequency band pass filter 26 passes through the selective contact 18f and the movable contact 18c of the switch 18 to be supplied to an intermediate frequency limiting amplifier (I.F. limiting amplifier) 27. In the intermediate frequency limiting amplifier 27, the frequency-modulated intermediate frequency signal SFI2 is amplified with a constant gain and limited in amplitude to be constant at a predetermined level. Then, the frequency-modulated intermediate frequency signal SFI2 obtained from the intermediate frequency limiting amplifier 27 with the amplitude limited to be constant at the predetermined level is supplied to a frequency-demodulator 28. The frequency-demodulator 28 is formed with a pulse counting demodulator.

Figure 2:
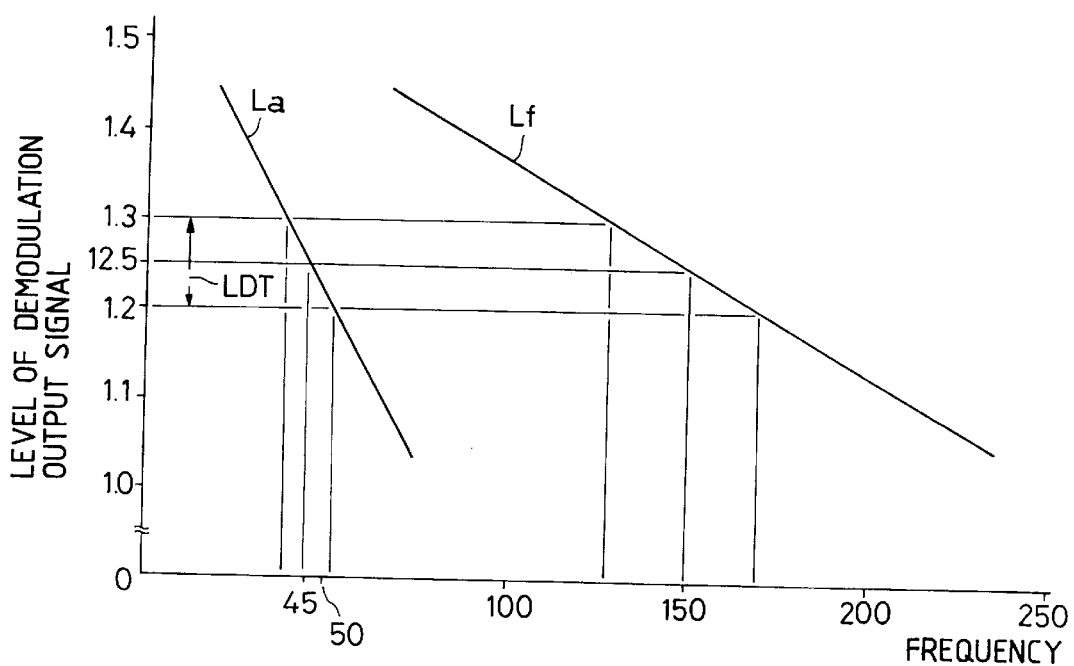
FIG. 2 is a characteristic chart used for explaining a demodulation characteristic in a frequency-demodulating portion employed in the broadcasting signal receiving apparatus shown in FIG. 1.

At this time, the control voltage signal VFA having the high level is supplied through an signal adder 29 to the frequency-demodulator 28 from the control unit 13 and the demodulation characteristic in the frequency-demodulator 28 is arranged in accordance with the control voltage signal VFA having the high level to be suitable for demodulating the frequency-modulated intermediate frequency signal SFI2, for example, as represented with a linear line Lf in a demodulation characteristic chart shown in FIG. 2. In the demodulation characteristic represented with the linear line Lf, a demodulation center frequency is coincident with the carrier frequency of the frequency-modulated intermediate frequency signal SFI2, namely, 150 kHz and the sensitivity of demodulation is relatively low.

In the frequency-demodulator 28, the frequency-modulated intermediate frequency signal SFI2 having the amplitude limited to be constant at the predetermined level is subjected to frequency-demodulation with the demodulation characteristic represented with the linear line Lf in the demodulation characteristic chart shown in FIG. 2, and a demodulation output signal SOF is obtained from the frequency-demodulator 28 to be supplied to a power amplifier 30. The power amplifier 30 is provided with function of muting operations.

The frequency-modulated intermediate frequency signal SFI2 obtained from the intermediate frequency limiting amplifier 27 is supplied also to one of a pair of input terminals of an AND circuit 33 and the demodulation output signal SOF obtained from the frequency-demodulator 28 is supplied also to a detune detector 34. The detune detector 34 produces a detection output signal SDD which has a high level when the demodulation output signal SOF is obtained actually based on the frequency-modulated intermediate frequency signal SFI2 which has the carrier frequency of 150 kHz and is subjected to the frequency-demodulation in the frequency-demodulator 28 and the level of the demodulation output signal SOF resides in a predetermined level range, such as a level range LDT in the demodulation characteristic chart shown in FIG. 2, and a low level when the level of the demodulation output signal SOF does not reside in the predetermined level range, such as the level range LDT in the demodulation characteristic chart shown in FIG. 2. The detection output signal SDD obtained from the detune detector 34 is supplied to the other of a pair of input terminals of the AND circuit 33. Accordingly, when the demodulation output signal SOF actually based on the frequency-modulated intermediate frequency signal SFI2 is obtained from the frequency-demodulator 28, the detection output signal SDD having the high level is derived from the detune detector 34 to be supplied to the other of a pair of input terminals of the AND circuit 33.

An output signal SFD corresponding to the frequency-modulated intermediate frequency signal SFI2 is obtained at the output end of the AND circuit 33 to which the frequency-modulated intermediate frequency signal SFI2 from the intermediate frequency limiting amplifier 27 and the detection output signal SDD having the high level from the detune detector 34 are supplied. The output signal SFD thus obtained from the AND circuit 33 is supplied to the control unit 13. From the control unit 13, a muting release signal CML is derived in response to the output signal SFD from the AND circuit 33 to be supplied to the power amplifier 30.

In the power amplifier 30 to which the muting release signal CML is supplied, the muting operation is ceased by the muting release signal CML and the demodulation output signal SOF from the frequency-demodulator 28 is amplified and supplied through the selective contact 19f and the movable contact 19c of the switch 19 and an output terminal 31 to a speaker 32. Therefore, reproduced sound which is a reproduced information output obtained based on the demodulation output signal SOF, that is, a reproduced information output obtained based on the received frequency-modulated broadcasting signal SF, is derived from the speaker 32.

A circuit portion including the detune detector 34 and the AND circuit 33 constitutes a condition detecting portion for detecting the frequency-modulated signal receiving condition, on the basis of the frequency-modulated intermediate frequency signal SFI2 from the intermediate frequency limiting amplifier 27 and the demodulation output signal SOF from the frequency-demodulator 28, and producing the output signal SFD as a detection output signal.

When an erroneous detection arises in the tuning amplifier 20 under the frequency-modulated signal receiving condition and therefore a frequency-modulated broadcasting signal received and amplified by the tuning amplifier 20 has an inappropriate carrier frequency different from the tuning frequency provided in the tuning amplifier 20, the frequency-modulated intermediate frequency signal SFI2 obtained from the frequency convertor 24 has a carrier frequency different from the appropriate carrier frequency of, for example, 150 kHz. Therefore, the detection output signal SDD having the low level is derived from the detune detector 34, to which the demodulation output signal SOF obtained by frequency-demodulating the frequency-modulated intermediate frequency signal SFI2 in the frequency-demodulator 28 is supplied, to be supplied to the other of a pair of input terminals of the AND circuit 33, and the output signal SFD corresponding to the frequency-modulated intermediate frequency signal SFI2 is not obtained from the AND circuit 33, so that the output signal SFD is not supplied to the control unit 13. Consequently, the muting release signal CML is not derived from the control unit 13 and the muting operation is not ceased in the power amplifier 30 so that reproduced sound is not obtained from the speaker 32.

Under such a condition, when the command signal CS requesting the automatic scanning tuning operation relative to the frequency-modulated broadcasting signals is supplied to the control unit 13 from the tuning controller 16, in the control unit 13, the tuning control voltage signal VCF supplied to the tuning amplifier 20 and the local oscillator 21 is varied in a predetermined manner in response to the command signal CS after the condition in which the output signal SFD corresponding to the frequency-modulated intermediate frequency signal SFI2 is not obtained from the AND circuit 33 is confirmed, so that each of the tuning frequency in the tuning amplifier 20 and the oscillation frequency in the local oscillator 21 is varied by a predetermined frequency width. As a result, a new tuning frequency and a new oscillation frequency are provided in the tuning amplifier 20 and the local oscillator 21, respectively, and the automatic scanning tuning operation relative to the frequency-modulated broadcasting signals is performed.

When the command signal CB from the receiving band selector 14 is supplied through the control terminal 15 to the control unit 13 for requesting the amplitude-modulated broadcasting signal band, the control voltage signal VFA having, for example, a low level for setting the amplitude-modulated signal receiving condition is derived from the control unit 13 in response to the command signal CB. With the control voltage signal VFA having the low level, the switch 18 is controlled to cause the movable contact 18c to be connected with a selective contact 18a, as shown with a solid line in FIG. 1, and the switch 19 is controlled to cause the movable contact 19c to be connected with a selective contact 19a, as shown with a solid line in FIG. 1, so that the amplitude-modulated signal receiving condition is set in the broadcasting signal receiving apparatus shown in FIG. 1.

Under the amplitude-modulated signal receiving condition thus set in the apparatus shown in FIG. 1, when the command signal CS requesting the automatic scanning tuning operation or the command signal CC requesting the tuning operation for tuning one of the amplitude-modulated broadcasting signals is supplied through the control terminal 17 to the control unit 13 from the tuning controller 16, a tuning control voltage signal VCA is supplied from the control unit 13 to a tuning amplifier 35 and a local oscillator 36. Thereby, a tuning frequency is provided to correspond to the tuning control voltage signal VCA in the tuning amplifier 35 and an oscillation frequency is provided to correspond to the tuning control voltage signal VCA in the local oscillator 36.

When the tuning frequency provided in the tuning amplifier 35 comes to a frequency substantially coincident with or very close to the carrier frequency of one of the amplitude-modulated broadcasting signals arriving upon the antenna 12 from the respective radio broadcasting stations, the amplitude-modulated broadcasting signal is received through an antenna terminal 37 by the tuning amplifier 35. The amplitude-modulated broadcasting signal thus received is amplified by the tuning amplifier 35 to be a received amplitude-modulated broadcasting signal SA supplied to a frequency convertor 38. An oscillation output signal SLA1 from the local oscillator 36 oscillating at the oscillation frequency corresponding to the tuning control voltage signal VCA is also supplied to the frequency convertor 38.

In the frequency convertor 38, the received amplitude-modulated broadcasting signal SA is frequency-converted in accordance with the oscillation output signal SLA1 to produce an amplitude-modulated intermediate frequency signal SAI1. The amplitude-modulated intermediate frequency signal SAI1 has a carrier frequency corresponding to the difference between the carrier frequency of the received amplitude-modulated broadcasting signal SA and the frequency of the oscillation output signal SLA1, which is set to be, for example, 450 kHz. The amplitude-modulated intermediate frequency signal SAI1 is further supplied to a frequency convertor 39. An oscillation output signal SLA2 from a local oscillator 40 oscillating at a predetermined constant oscillation frequency is also supplied to the frequency convertor 39.

In the frequency convertor 39, the amplitude-modulated intermediate frequency signal SAIL is further frequency-converted in accordance with the oscillation output signal SLA2 to produce an amplitude-modulated intermediate frequency signal SAI2. The amplitude-modulated intermediate frequency signal SAI2 has a carrier frequency corresponding to the difference between the carrier frequency of the amplitude-modulated intermediate frequency signal SAI2 and the frequency of the oscillation output signal SIA2, which is set to be, for example, 45 kHz. The amplitude-modulated intermediate frequency signal SAI2 having the carrier frequency of, for example, 45 kHz and obtained from the frequency convertor 39 is supplied to an intermediate frequency band pass filter (I.F. filter) 41. In the intermediate frequency band pass filter 41, a frequency band selection characteristic can be adjusted with a control voltage signal supplied thereto from the outside.

A circuit portion including the above mentioned tuning amplifier 35, local oscillators 36 and 40 and frequency convertors 38 and 39 constitutes an amplitude-modulated broadcasting signal receiving portion which is operative to receive selectively amplitude-modulated broadcasting signals and to obtain an amplitude-modulated intermediate frequency signal based on a received frequency-modulated broadcasting signal.

The amplitude-modulated intermediate frequency signal SAI2 having passed through the intermediate frequency band pass filter 41 is supplied to an intermediate frequency amplifier (I.F. amplifier) 42 and the selective contact 18a of the switch 18. The amplitude-modulated intermediate frequency signal SAI2 amplified by the intermediate frequency amplifier 42 is supplied to an amplitude-demodulator 43 and a demodulation output signal SOA based on the amplitude-modulated intermediate frequency signal SAI2 is derived from the amplitude-demodulator 43.

The demodulation output signal SOA is supplied to a power amplifier 45 and an automatic gain control signal generator (A.G.C. signal generator) 44. The power amplifier 45 is provided with a muting function. The demodulation output signal SOA is further supplied to one of a pair of input terminals of an AND circuit 46.

In the automatic gain control signal generator 44, an automatic gain control signal SGC corresponding to the level of the demodulation output signal SOA is generated to be supplied to the intermediate frequency amplifier 42. In the intermediate frequency amplifier 42, an automatic gain control operation by which a gain for amplifying is reduced when the level of the demodulation output signal SOA obtained from the amplitude-demodulator 43 increases in excess of a predetermined level and increased when the level of the demodulation output signal SOA decreases to be lower than the predetermined level is performed and thereby the level of the demodulation output signal SOA is so controlled as to have continuously the predetermined level.

The amplitude-modulated intermediate frequency signal SAI2 supplied to a fixed contact 18a of the switch 18 passes through the fixed contact 18a and the movable contact 18c of the switch 18 to be supplied to the intermediate frequency limiting amplifier 27. In the intermediate frequency limiting amplifier 27, the amplitude-modulated intermediate frequency signal SAI2 is amplified with the constant gain and limited in amplitude to be constant at the predetermined level. Then, the amplitude-modulated intermediate frequency signal SAI2 obtained from the intermediate frequency limiting amplifier 27 with the amplitude limited to be constant at the predetermined level is supplied to the frequency-demodulator 28 which is formed with the pulse counting demodulator. In this case, the switch 18 constitutes a signal supplying portion operative to supply the frequency-demodulator 28 with the amplitude-modulated intermediate frequency signal SAI2 derived from the intermediate frequency band pass filter 41.

At this time, the control voltage signal VFA having the low level is supplied through the signal adder 29 to the frequency-demodulator 28 from the control unit 13 and the demodulation characteristic in the frequency-demodulator 28 is arranged in accordance with the control voltage signal VFA having the low level to be suitable for demodulating the amplitude-modulated intermediate frequency signal SAI2, for example, as represented with a linear line La in the demodulation characteristic chart shown in FIG. 2. In the demodulation characteristic represented with the linear line La, a demodulation center frequency is coincident with the carrier frequency of the amplitude-modulated intermediate frequency signal SAI2, namely, 45 kHz and the sensitivity of demodulation is relatively low.

In the frequency-demodulator 28, the amplitude-modulated intermediate frequency signal SAI2 having the amplitude limited to be constant at the predetermined level is subjected to frequency-demodulation with the demodulation characteristic represented with the linear line La in the demodulation characteristic chart shown in FIG. 2, and a demodulation output signal SOF is obtained. This demodulation output signal SOF has a level corresponding to the carrier frequency of the amplitude-modulated intermediate frequency signal SAI2, namely, 45 kHz and supplied to the power amplifier 30 and the detune detector 34.

The detune detector 34 produces a detection output signal SDD which has a high level when the demodulation output signal SOF is obtained based on the amplitude-modulated intermediate frequency signal SAI2 which has the carrier frequency of, for example, 45 kHz and is subjected to the frequency-demodulation in the frequency-demodulator 28 and the level of the demodulation output signal SOF resides in a predetermined level range, such as the level range LDT in the demodulation characteristic chart shown in FIG. 2, and a low level when the level of the demodulation output signal SOF does not reside in the predetermined level range, such as the level range LDT in the demodulation characteristic chart shown in FIG. 2. The detection output signal SDD obtained from the detune detector 34 is supplied to the other of a pair of input terminals of the AND circuit 33. Accordingly, when the demodulation output signal SOF based on the amplitude-modulated intermediate frequency signal SAI2 is obtained from the frequency-demodulator 28, the detection output signal SDD having the high level is derived from the detune detector 34 to be supplied to the other of a pair of input terminals of the AND circuit 46.

An output signal SAD corresponding to the demodulation output signal SOA is obtained at the output end of the AND circuit 46 to which the demodulation output signal SOA obtained from the amplitude-demodulator 43 and the detection output signal SDD having the high level from the detune detector 34 are supplied. From the control unit 13, the muting release signal CML is derived in response to the output signal SAD from the AND circuit 46 to be supplied to the power amplifier 45.

In the power amplifier 45 to which the muting release signal CML is supplied, the muting operation is ceased by the muting release signal CML and the demodulation output signal SOA from the amplitude-demodulator 43 is amplified and supplied through the selective contact 19a and the movable contact 19c of the switch 19 and the output terminal 31 to the speaker 32. Therefore, reproduced sound which is a reproduced information output obtained based on the demodulation output signal SOA, that is, a reproduced information output obtained based on the received amplitude-modulated broadcasting signal SA, is derived from the speaker 32.

A circuit portion including the power amplifiers 30 and 45, the switch 19 and the speaker 32 constitutes an output portion for obtaining the reproduced information outputs. A circuit portion including the detune detector 34 and the AND circuit 46 constitutes a condition detecting portion for detecting the amplitude-modulated signal receiving condition, on the basis of the demodulation output signal SOF from the frequency-demodulator 28 and the demodulation output signal SOA from the amplitude-demodulator 43, and producing the output signal SAD as a detection output signal.

When an erroneous detection arises in the tuning amplifier 35 under the amplitude-modulated signal receiving condition and therefore an amplitude-modulated broadcasting signal received and amplified by the tuning amplifier 35 has an inappropriate carrier frequency different from the tuning frequency provided in the tuning amplifier 35, the amplitude-modulated intermediate frequency signal SAI2 obtained from the frequency convertor 39 has a carrier frequency different from the appropriate carrier frequency of, for example, 45 kHz. Therefore, the detection output signal SDD having the low level is derived from the detune detector 34, to which the demodulation output signal SOF obtained by frequency-demodulating the frequency-modulated intermediate frequency signal SFI2 in the frequency-demodulator 28 is supplied, to be supplied to the other of a pair of input terminals of the AND circuit 46, and the output signal SAD corresponding to the demodulation output signal SOA from the amplitude-modulator 43 is not obtained from the AND circuit 46, so that the output signal SAD is not supplied to the control unit 13. Consequently, the muting release signal CML is not derived from the control unit 13 and the muting operation is not ceased in the power amplifier 45 so that reproduced sound is not obtained from the speaker 32.

Under such a condition, when the command signal CS requesting the automatic scanning tuning operation relative to the amplitude-modulated broadcasting signals is supplied to the control unit 13 from the tuning controller 16, in the control unit 13, the tuning control voltage signal VCA supplied to the tuning amplifier 35 and the local oscillator 36 is varied in a predetermined manner in response to the command signal CS after the condition in which the output signal SAD corresponding to the demodulation output signal SOA from the amplitude-demodulator 43 is not obtained from the AND circuit 46 is confirmed, so that each of the tuning frequency in the tuning amplifier 35 and the oscillation frequency in the local oscillator 36 is varied by a predetermined frequency width. As a result, a new tuning frequency and a new oscillation frequency are provided in the tuning amplifier 35 and the local oscillator 36, respectively, and the automatic scanning tuning operation relative to the amplitude-modulated broadcasting signals is performed.

In the above described embodiment shown in FIG. 1, a circuit portion including the control unit 13 and the AND circuits 33 and 46 constitutes an operation control portion operative to use the demodulation output signal SOF obtained from the frequency-demodulator 28 to which the amplitude-modulated broadcasting signal obtained from the intermediate frequency band pass filter 41 is supplied for controlling the frequency-modulated signal receiving condition in the frequency-modulated broadcasting signal receiving portion which includes the tuning amplifier 20, the local oscillators 21 and 25 and the frequency convertors 23 and 24 and the amplitude-modulated signal receiving condition in the amplitude-modulated broadcasting signal receiving portion which includes the tuning amplifier 35, the local oscillators 36 and 40 and the frequency convertors 38 and 39.

Further, in the embodiment shown in FIG. 1, a control voltage generator 48 operative to produce a control voltage signal VX and to supply each of the intermediate frequency band pass filter 41 and the frequency-demodulator 28 with the control voltage signal VX is provided and a variable resistor 50 for adjustment is connected through a control terminal 49 with the control voltage generator 48. These control voltage generator 48 is incorporated into an integrated circuit device, together with the intermediate frequency band pass filter 41, the frequency-demodulator 28 and a large number of other parts. While, the variable resistor 50 is provided on the outside of the integrated circuit device.

The variable resistor 50 for adjustment forms a control signal adjusting portion for adjusting the control voltage signal VX produced by the control voltage generator 48. When the resistance of the variable resistor 50 is manipulated manually, for example, to vary the resistance thereof, the control voltage signal VX which is produced by the control voltage generator 48 to be supplied to the intermediate frequency band pass filter 41 and through the signal adder 29 to the frequency-demodulator 28 is varied to be adjusted in response to the variations in resistance of the control voltage generator 48. Accordingly, the frequency band selection characteristic in the intermediate frequency band pass filter 41 and the frequency-demodulation characteristic in the frequency-demodulator 28 are adjusted respectively in accordance with the variations in the control voltage signal VX.

With the adjustments by the control voltage signal VX supplied from the control signal generator 48, each of the frequency-demodulation characteristic in the frequency-demodulator 28 and the frequency band selection characteristic in the intermediate frequency band pass filter 41 is caused to coincide with a predetermined desirable characteristic when it has deviated from that predetermined desirable characteristic due to, for example, dispersion in characteristic of each circuit element, such as a semiconductor element or the like, constituting the intermediate frequency band pass filter 41, the frequency-demodulator 28 and circuit portions provided around them. The adjustments are easily and adequately carried out by manipulating manually the variable resistor 50 provided on the outside of the of the integrated circuit device to vary the resistance thereof.

Figure 3:
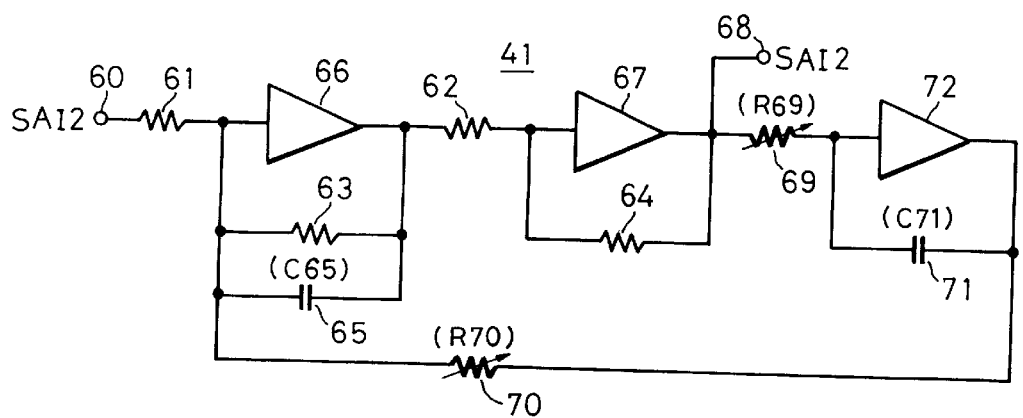
FIG. 3 is a circuit diagram showing an embodiment of intermediate frequency band pass filter employed in the broadcasting signal receiving apparatus shown in FIG. 1.

FIG. 3 shows a practical example of the intermediate frequency band pass filter 41 for amplitude-modulated intermediate frequency signals employed in the embodiment shown in FIG. 1.

Referring to FIG. 3, the amplitude-modulated intermediate frequency signal SAI2 supplied to an input terminal 60 is limited in its frequency band by a frequency selecting portion constituted with resistors 61, 62, 63 and 64, a capacitor 65 and operational amplifiers 66 and 67 and derived from an output terminal 68 to be supplied through a feedback path portion constituted with variable resistors 69 and 70, a capacitor 71 and an operational amplifier 72 to an input end of the operational amplifier 66.

In the practical example of the intermediate frequency band pass filter 41 shown in FIG. 3, a center frequency of the frequency pass band is set in accordance with a time constant determined by the resistance of the variable resistor 70 and the capacitance of the capacitor 65 and a time constant determined by the resistance of the variable resistor 69 and the capacitance of the capacitor 71. Supposing that Fc represents the center frequency, R70 represents the resistance of the variable resistor 70, C65 represents the capacitance of the capacitor 65, R69 represents the resistance of the variable resistor 69 and C71 represents the capacitance of the capacitor 71, the following relation is satisfied.

$$Fc = 1/(2 \cdot \pi \cdot R70 \cdot C65) = 1/(2 \cdot \pi \cdot R69 \cdot C71)$$

This means that the center frequency Fc can be varied in accordance with variations in the resistance R70 of the variable resistor 70 and the resistance R69 of the variable resistor 69.

Figure 4:
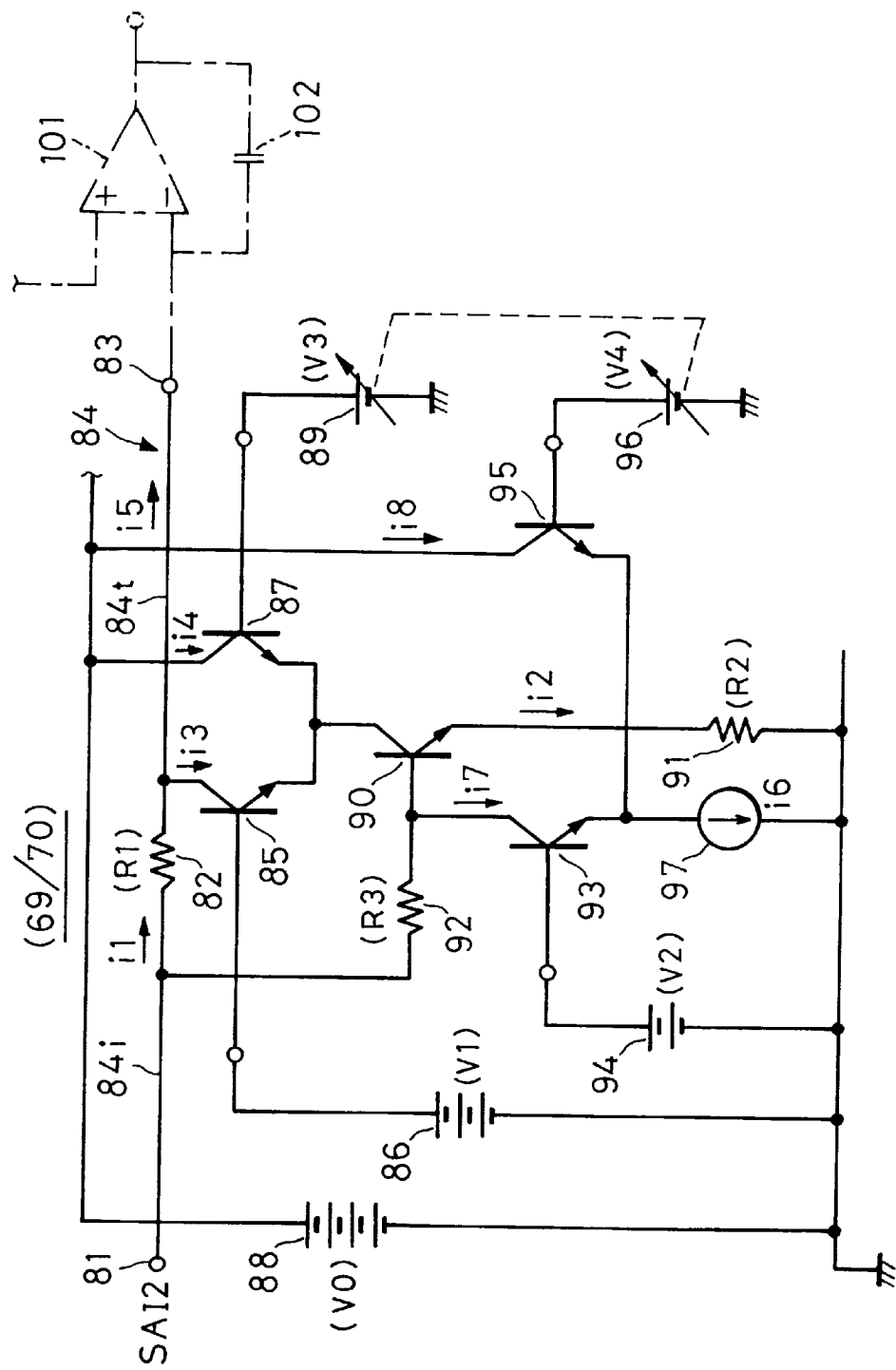
FIG. 4 is a circuit diagram showing an embodiment of equivalent variable resistant circuit used for forming equivalently a variable resistor employed in the intermediate frequency band pass filter shown in FIG. 3.

FIG. 4 shows an embodiment of equivalent variable resistant circuit used for forming equivalently the variable resistors 70 and 69 employed in the example shown in FIG. 3.

Referring to FIG. 4, a signal path 84 is provided to extend from a signal input terminal 81 to which the amplitude-modulated intermediate frequency signal SAI2 is supplied through a resistor 82 to a signal output terminal 83 as an input signal. The signal path 84 is divided into a signal input portion 84$i$ between the signal input terminal 81 and the resistor 82 and a signal output portion 84$t$ between the resistor 82 and the signal output terminal 83.

A collector of a transistor 85 of the NPN type is connected to the signal output portion 84$t$. A base of the transistor 85 is connected with a constant DC voltage source 86 for supplying a constant DC voltage and an emitter of the transistor 85 is connected with an emitter of a transistor 87 of the NPN type. A collector of the transistor 87 is connected with a DC voltage source 88 and a base of the transistor 87 is connected with a variable DC voltage source 89 for supplying a variable DC voltage. The emitters of the transistors 85 and 87 are connected with each other to form a differential pair of the transistors 85 and 87.

A collector of a transistor 90 of the NPN type is connected to the emitters of the transistors 85 and 87 connected with each other. An emitter of the transistor 90 is connected through a resistor 91 to a reference potential point (a grounded point) and a base of the transistor 90 is connected through a resistor 92 to the signal input portion 84$i$ of the signal path 84. The transistor 90 and the resistor 91 constitute a voltage to current converting portion.

A collector of a transistor 93 of the NPN type is connected with the base of the transistor 90. A base of the transistor 93 is connected with a constant DC voltage source 94 for supplying a constant DC voltage and an emitter of the transistor 93 is connected with an emitter of a transistor 95 of the NPN type. A collector of the transistor 95 is connected with the DC voltage source 88 and a base of the transistor 95 is connected with a variable DC voltage source 96 for supplying a variable DC voltage. The transistors 93 and 95 form a differential pair with the emitters which are connected in common and to which a current source 97 is connected.

The constant DC voltage source 86 connected with the base of the transistor 85 to supply the same with the constant DC voltage and the variable DC voltage source 89 connected with the base of the transistor 87 to supply the same with the variable DC voltage forms a voltage controlling portion operative to vary a DC voltage supplied between the base of the transistor 85 and the base of the transistor 87 as occasion demands. Similarly, the constant DC voltage source 94 connected with the base of the transistor 93 to supply the same with the constant DC voltage and the variable DC voltage source 96 connected with the base of the transistor 95 to supply the same with the variable DC voltage forms a voltage controlling portion operative to vary a DC voltage supplied between the base of the transistor 93 and the base of the transistor 95 as occasion demands.

The variable DC voltage sources 89 and 96 are linked with each other to vary the respective variable DC voltages simultaneously.

The operation of the equivalent variable resistance circuit shown in FIG. 4 and mentioned above will be explained below on the supposition that an operational amplifier 101 and a capacitor 102 are connected in parallel with each other to the signal output terminal 83, as shown with broken lines in FIG. 4. In the explanation, R1, R2 and R3 represent resistances of the resistors 82, 91 and 92, respectively, V0 represents a DC voltage supplied from the DC voltage source 88, which is, for example, 2V, V1 and V2 represent the constant DC voltages supplied from the constant DC voltage sources 86 and 94, which are, for example, 1.65V and 1.25V, respectively, and V3 and V4 represent the variable DC voltages supplied from the variable DC voltage sources 89 and 96, respectively.

The input signal SAI2 supplied to the signal input terminal 81 produces a current i1 flowing through the signal path provided with the resistor 82 and is supplied through the resistor 92 to the base of the transistor 90. The transistor 90 and the resistor 91 constituting the voltage to current converting portion are operative to produce a current i2 corresponding to the input signal SAI2 and flowing through a collector-emitter path of the transistor 90 and the resistor 91.

A part of the current i2 flowing through the collector-emitter path of the transistor 90 and the resistor 91 forms a current i3 flowing through an collector-emitter path of the transistor 85 and another path of the current i2 forms a current i4 flowing through an collector-emitter path of the transistor 87 (i2=i3+i4). Therefore, a current i5 obtained by subtracting the current i3 from the current i1 (i5=i1−i3) flows through the signal output portion 84*t* of the signal path 84 to be supplied through the signal output terminal 83 to the capacitor 102.

Under such a condition, when the variable DC voltage V3 supplied to the base of the transistor 87 from the variable DC voltage source 89 is varied, the DC voltage supplied between the base of the transistor 87 and the base of the transistor 85 to which the constant DC voltage V1 supplied from the constant DC voltage source 86 is varied in accordance with the variations in the variable DC voltage V3. Accordingly, a base potential of the transistor 85 is varied with reference to a voltage potential at the base of the transistor 87 and therefore a ratio a of the current i4 flowing through the collector-emitter path of the transistor 87 to the current i3 flowing through the collector-emitter path of the transistor 85 is varied ($\alpha$=i4/i3).

Since the current i2 flowing through the collector-emitter path of the transistor 90 and the resistor 91 is kept constant, each of the current i3 flowing through the collector-emitter path of the transistor 85 and the current i4 flowing through the collector-emitter path of the transistor 87 is varied so that the current i5 supplied through the signal output terminal 83 to the capacitor 102 is varied. In such a manner, the current i5 supplied through the signal output terminal 83 to the capacitor 102 is varied in response to the variations in the variable DC voltage V3 supplied to the base of the transistor 87 from the variable DC voltage source 89. This is equivalent to that a resistance between the signal input terminal 81 and the signal output terminal 83 of the signal path 84 is varied in response to the variations in the variable DC voltage V3 supplied to the base of the transistor 87 from the variable DC voltage source 89 and consequently the equivalent variable resistant circuit shown in FIG. 4 functions in its entirety as a variable resistor.

Assuming that vi represents a voltage of the input signal SAI2, the currents i1 and i2 flowing through the resistors 82 and 91, respectively, are represented with the following equations.

$$i1 = vi/R1$$

$$i2 = vi/R2$$

In connection with the current i2 flowing through the resistor 91, the current i3 flowing through the collector-emitter path of the transistor 85 and the current i4 flowing through the collector-emitter path of the transistor 87, there are the relations represented with following equations.

$$i2 = i3 + i4$$
$$= i3 + \alpha \cdot i3$$
$$= (1 + \alpha) \cdot i3,$$
$$i3 = i2/(1 + \alpha)$$

Supposing Y=1/(1+$\alpha$), the current i3 is represented as follows.

$$i3 = Y \cdot i2$$

Therefore, the current i5 supplied through the signal output terminal 83 to the capacitor 102 is represented with the following equations.

$$i5 = i1 - i3$$
$$= i1 - Y \cdot i2$$
$$= vi/R1 - Y \cdot vi/R2$$
$$= vi \cdot (R2 - Y \cdot R1)/(R1 \cdot R2)$$

Assuming that Rx represents an equivalent resistance between the signal input terminal 81 and the signal output terminal 83 of the signal path 84, the following equations are satisfied.

$$Rx = vi/i5 = (R1 \cdot R2)/(R2 - Y \cdot R1)$$

Consequently, the equivalent resistance Rx obtained by the equivalent variable resistance circuit shown in FIG. 4 functioning in its entirety as the variable resistor is represented as (R1·R2)/(R2−Y·R1) and varied in accordance with variations in Y=1/(1+α), namely, variations in the ratio a of the current i4 to the current i3.

Further, in the equivalent variable resistance circuit shown in FIG. 4, assuming that i6 represents a current flowing through the current source 97, i7 represents a current flowing through the collector-emitter path of the transistor 93 and i8 represents a current flowing through the collector-emitter path of the transistor 95, a part of the current i6 forms a current i7 flowing through the collector-emitter path of the transistor 93 and another part of the current i6 forms a current i8 flowing through the collector-emitter path of the transistor 95, and therefore the following equation is satisfied.

$$i6=i7+i8.$$

The variable DC voltage V4 supplied to the base of the transistor 95 from the variable DC voltage source 96 is varied simultaneously with variations in the variable DC voltage V3 supplied to the base of the transistor 87 from the variable DC voltage source 89, and a difference between the variable DC voltage V3 and the constant DC voltage V1 supplied to the base of the transistor 85 from the constant DC voltage source 86 and a difference between the variable DC voltage V4 and the constant DC voltage V2 supplied to the base of the transistor 93 from the constant DC voltage source 94 are kept always equal to each other to $$\Delta V(=V1-V3=V4-V2).$$

Accordingly, a ratio of the current i8 flowing through the collector-emitter path of the transistor 95 to the current i7 flowing through the collector-emitter path of the transistor 93 is equal to the ration α of the current i4 flowing through the collector-emitter path of the transistor 87 to the current i3 flowing through the collector-emitter path of the transistor 85 (α=i4/i3=i8/i7), and between the current i6 flowing through the current source 97 and the current i7 flowing through the collector-emitter path of the transistor 93, there is the relation represented with the following equations.

$$i7=i6/(1+\alpha)=Y\cdot i6$$

Further, in the equivalent variable resistant circuit shown in FIG. 4, a voltage drop raised at the resistor 82 by the current i3 flowing therethrough, which is represented as i3·R1=Y·i2·R2, and a voltage drop raised at the resistor 92 by the current i7 flowing therethrough, which is represented as i7·R3=Y·i6·R3, are arranged to be equal to each other (Y·i2·R2=Y·i6·R3).

Under such a condition, when the variable DC voltage V3 supplied to the base of the transistor 87 from the variable DC voltage source 89 is varied, the DC voltage (ΔV) supplied between the base of the transistor 87 and the base of the transistor 85 to which the constant DC voltage V1 supplied from the constant DC voltage source 86 is varied in accordance with the variations in the variable DC voltage V3. Accordingly, the ratio α of the current i4 flowing through the collector-emitter path of the transistor 87 to the current i3 flowing through the collector-emitter path of the transistor 85 is varied so that the current i3 is varied. Consequently, the voltage drop at the resistor 82 caused by the current i3 flowing therethrough is varied and a voltage potential at the signal input portion 84i of the signal path 84 is varied.

At this time, since the variable DC voltage V4 supplied to the base of the transistor 95 from the variable DC voltage source 96 is also varied simultaneously with the variations in the variable DC voltage V3, the DC voltage (ΔV) supplied between the base of the transistor 95 and the base of the transistor 93 to which the constant DC voltage V2 supplied from the constant DC voltage source 94 is varied in accordance with the variations in the variable DC voltage V4. Accordingly, the ratio a of the current i8 flowing through the collector-emitter path of the transistor 95 to the current i7 flowing through the collector-emitter path of the transistor 93 is varied so that the current i7 is varied. Consequently, the voltage drop at the resistor 92 caused by the current i7 flowing therethrough is also varied.

Since the voltage drop at the resistor 82 caused by the current i3 flowing therethrough and the voltage drop at the resistor 92 caused by the current i7 flowing therethrough are arranged to be equal to each other, the variations in the voltage drop at the resistor 82 and the variations in the voltage drop at the resistor 92 are equal to each other. Therefore, when the voltage potential at the signal input portion 84i of the signal path 84 is varied in accordance with the variations in the voltage drop at the resistor 82, the variations in the voltage drop at the resistor 82 are absorbed by the variations in the voltage drop at the resistor 92 and the voltage potential at the base of the transistor 90 is not varied.

As described above, with the structure including the transistors 93 and 95 constituting the differential pair, the current source 97, the constant DC voltage source 94 supplying the base of the transistor 93 with the constant DC voltage V2, the variable DC voltage source 96 supplying the base of the transistor 95 with the variable DC voltage V4 and varying the variable DC voltage V4 simultaneously with the variations in the variable DC voltage V3 supplied to the base of the transistor 87 from the variable DC voltage source 89, which are arranged in such manners as described above, the voltage potential at the base of the transistor 90 is maintained to be substantially constant so that the equivalent resistance Rx between the signal input terminal 81 and the signal output terminal 83 of the signal path 84 is appropriately varied when the variable DC voltage V3 supplied to the base of the transistor 87 from the variable DC voltage source 89 is varied with intent to vary the equivalent resistance Rx.

Figure 5:
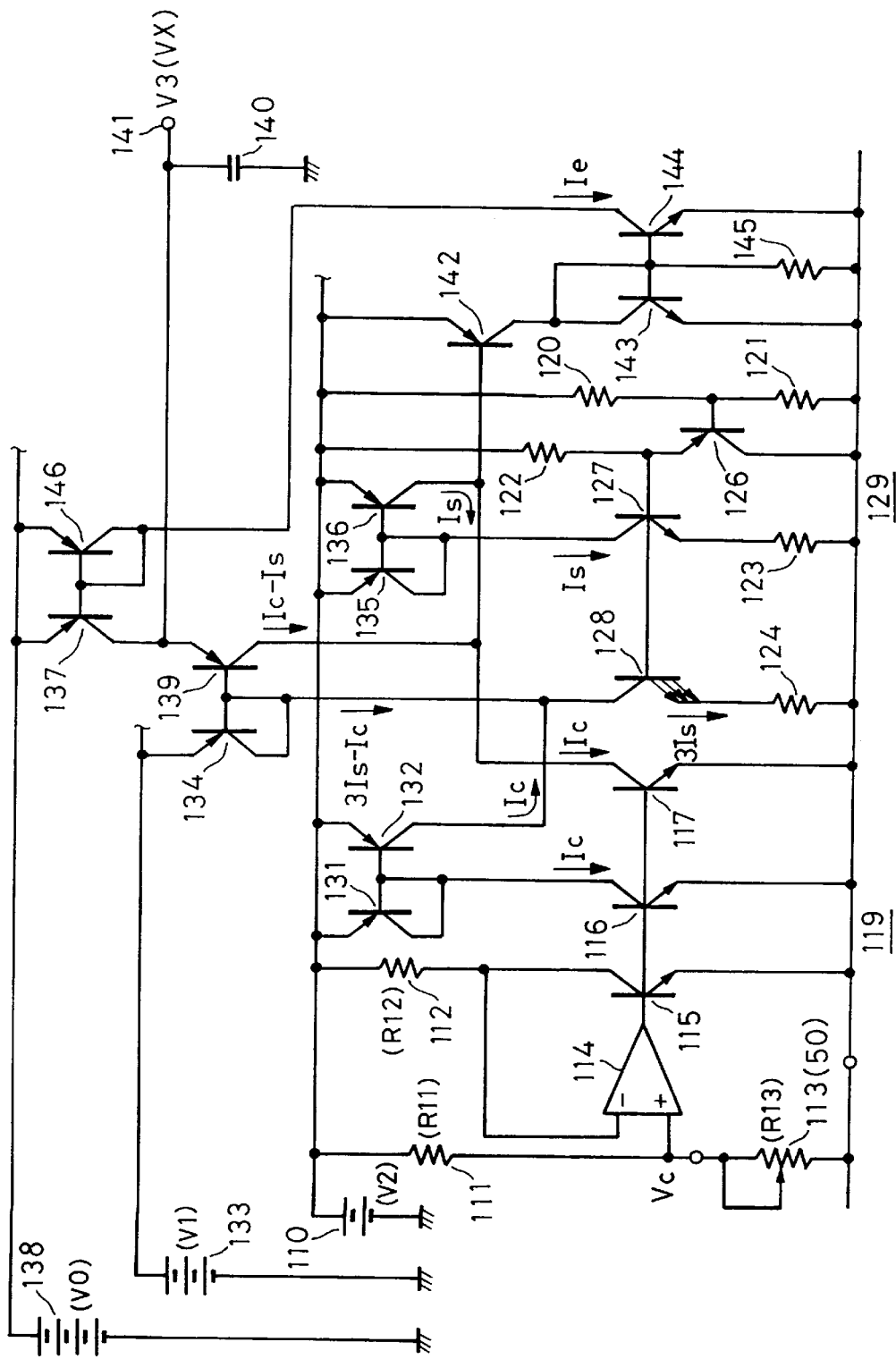
FIG. 5 is a circuit diagram showing an embodiment of a variable DC voltage source employed in the equivalent variable resistant circuit shown in FIG. 4.

FIG. 5 shows an embodiment of the variable DC voltage source 89 for supplying with the variable DC voltage V3 in the equivalent variable resistant circuit shown in FIG. 4.

Referring to FIG. 5, in a circuit portion to which a constant DC voltage source 110 for supplying with the constant DC voltage V2 (for example, 1.25V) is connected to constitute a power source, a voltage to current converting portion 119 which comprises resistors 111 and 112, a variable resistor 113 for adjustment, an operational amplifier 114 and transistors 115, 116 and 117 of the NPN type, and a current source portion 129 which comprises resistors 120, 121, 122, 123 and 124, a transistor 126 of the PNP type and transistors 127 and 128 of the NPN type and is operative to supply with a current suppressed in variations due to temperature variations, are provided.

In the voltage to current converting portion 119, a voltage Vc obtained at a connecting point between the resistor 111 and the variable resistor 113 is supplied to an input terminal of the operational amplifier 114 and a current Ic flowing through a collector-emitter path of each of the transistors 116 and 117 so as to correspond to the voltage Vc supplied to the operational amplifier 114 results from a negative feedback operation carried out by a circuit portion including the operational amplifier 114, the transistor 115 and the resistor 112. The voltage Vc is varied in accordance with variations in resistance of the variable resistor 113. Accordingly, the variations in resistance of the variable resistor 113 causes the voltage Vc to vary and thereby causes further the current Ic flowing through the collector-emitter path of each of the transistors 116 and 117 to vary. This means that the current Ic is a variable DC current varying in response to the variations in resistance of the variable resistor 113.

Assuming that R11 represents resistance of the resistor 111, R12 represents resistance of the resistor 112 and R13 represents the resistance of the variable resistor 113, the current Ic is represented with the following equation.

$$Ic = V2 \cdot R11 / ((R11+R12) \cdot R13)$$

In the current source portion 129, the transistor 128 has its emitter area three times as broad as an emitter area of the transistor 127 and therefore a current Is flows through a collector-emitter path of the transistor 127 and a current 3Is which is three times as large as the current Is flows through a collector-emitter path of the transistor 128. The current Is is a DC current smaller than the current Ic and the current 3Is is a DC current larger than the current Ic.

The current Ic flowing through the collector-emitter path of the transistors 116 further flows through a collector-emitter path of a transistor 131 of the PNP type, which forms a current mirror portion together with a transistor 132 of the PNP type, and therefore another current Ic flows through a collector-emitter path of the transistor 132. The current Ic flowing through the collector-emitter path of the transistor 132 further flows through a collector-emitter path of the transistor 128. Consequently, a current 3Is_|Ic flows through an emitter-collector path of a transistor 134 of the PNP type which has its emitter connected to a constant DC voltage source 133 for supplying with the constant DC voltage V1 (for example, 1.65V) and its collector connected to a collector of the transistor 128.

The current Is flowing through the collector-emitter path of the transistors 127 flows through an emitter-collector path of a transistor 135 of the PNP type, which forms a current mirror portion together with a transistor 136 of the PNP type, and therefore another current Is flows through an emitter-collector path of the transistor 136. The current Is flowing through the emitter-collector path of the transistor 136 further flows through a collector-emitter path of the transistor 117. Consequently, a current Ic–Is flows through an emitter-collector path of a transistor 139 of the PNP type which has its emitter connected through an emitter-collector path of a transistor 137 of the PNP type to a DC voltage source 138 for supplying with the DC voltage V0 (for example, 2V) and its collector connected to a collector of the transistor 117.

A capacitor 140 is connected between an emitter of the transistor 139 and the grounded point and a voltage output terminal 141 is connected to one end of the capacitor 140 connected with the emitter of the transistor 139. A variable DC voltage varying in response to the variations in the current Ic is obtained at the voltage output terminal 141. This variable DC voltage obtained at the voltage output terminal 141 is used as the variable DC voltage V3 supplied from the variable DC voltage source 89 in the equivalent variable resistant circuit shown in FIG. 4.

A circuit portion including the transistors 134 and 139 and the capacitor 140 connecter with the collector of the transistor 139, through which a difference current (3Is–Ic) corresponding to a difference between the current Ic obtained from the voltage to current converting portion 119 and the current 3Is obtained from the current source portion 129 and a difference current (Is–Ic) corresponding to a difference between the current Ic obtained from the voltage to current converting portion 119 and the current Is obtained from the current source portion 129 flow, constitutes a current to voltage converting portion producing the variable DC voltage V3 corresponding to the difference current (3Is–Ic) or (Ic–Is).

Although the current Ic–Is flows through the emitter-collector path of the transistor 139 under an appropriate condition as described above, it is feared that a current which is deviated from the current Ic–Is flows through the emitter-collector path of the transistor 139 when the DC voltage V0 supplied from the DC voltage source 138, for example. To avoid such a situation, the current flowing through the emitter-collector path of the transistor 139 is automatically corrected to eliminate deviations from the current Ic–Is in the embodiment of the variable DC voltage source 89 shown in FIG. 5.

In the embodiment shown in FIG. 5, a base of a transistor 142 of the PNP type is connected with a connecting point between the collector of the transistor 117 and the collector of the transistor 139 and the deviation from the current Ic–Is on the current flowing through the emitter-collector path of the transistor 139 is detected by the transistor 142. When the deviation from the current Ic–Is on the current flowing through the emitter-collector path of the transistor 139 is detected by the transistor 142, a detection output obtained from the transistor 142 causes a current Ie flowing through a collector-emitter path of a transistor 144 of the NPN type to vary. The transistor 144 constitutes a current control circuit potion together with a transistor 143 of the NPN type and a resistor 145.

The current Ie flowing through the collector-emitter path of the transistor 144 flows through an emitter-collector path of a transistor 146 of the PNP type having its emitter connected with the constant DC voltage source 138, its collector is connected with a collector of the transistor 144 and its base is connected with a base of the transistor 137. The transistor 146 and the transistor 137 constitute a current mirror portion. Accordingly, the current Ie flowing through the emitter-collector path of the transistor 146 is varied in response to the detection output obtained from the transistor 142 when the current Ie flowing through the collector-emitter path of the transistor 144 is varied in response to the detection output obtained from the transistor 142. Consequently, the current flowing through the emitter-collector path of the transistor 137 is varied in response to the detection output obtained from the transistor 142.

The variations in the current flowing through the emitter-collector path of the transistor 137 in response to the detection output obtained from the transistor 142 are raised in such a manner as to cause the detection output obtained from the transistor 142 to be zero, that is, to cause the deviation from the current Ic–Is on the current flowing through the emitter-collector path of the transistor 139 to be eliminated. Therefore, the current flowing through the emitter-collector path of the transistor 139 is maintained to be substantially coincident with the current Ic–Is.

In the manner as described above, in the embodiment shown in FIG. 5, the variable DC voltage V3 is obtained at the voltage output terminal 141, and when the resistance (R13) of the variable resistor 113 is varied manually, for example, the current Ic obtained in the voltage-current converting portion 119 is varied in response to variations in the resistance of the variable resistor 113 and then the variable DC voltage V3 obtained at the voltage output terminal 141 is varied in response to variations in the current Ic. Consequently, the variable DC voltage source 89 in the equivalent variable resistant circuit shown in FIG. 4 is surely constituted with the embodiment shown in FIG. 5.

Such an embodiment of the variable DC voltage source 89 in the equivalent variable resistant circuit shown in FIG. 4 as shown in FIG. 5 without the variable resistor 113, is actually arranged to constitute a part of the control voltage generator 48 employed in the broadcasting signal receiving apparatus shown in FIG. 1 for supplying the variable DC voltage V3 as the control voltage signal VX. The variable resistor 113 constitutes the variable resistor 50 for adjustment employed in the broadcasting signal receiving apparatus shown in FIG. 1.

Figure 6:
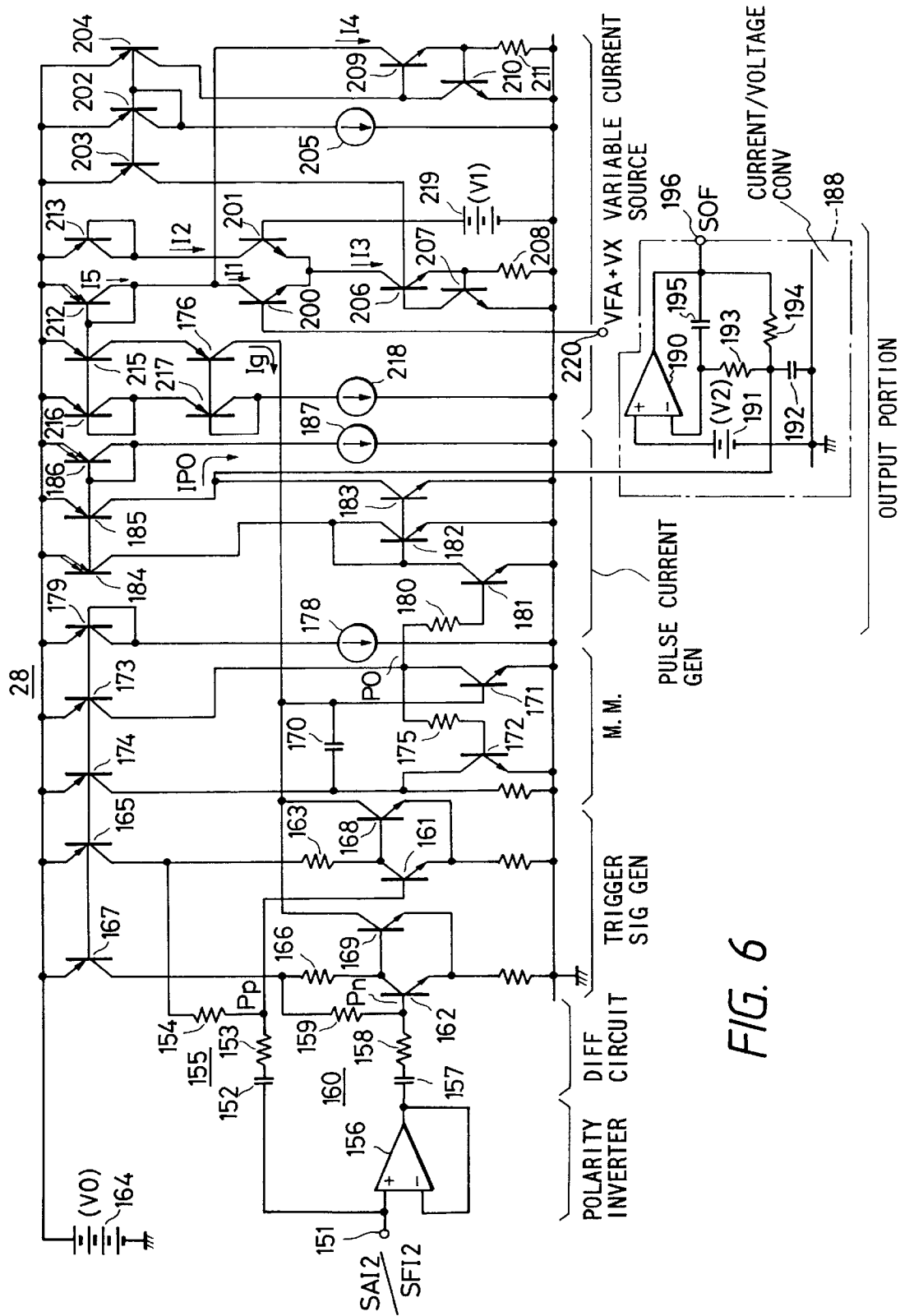
FIG. 6 is a circuit diagram showing an embodiment of a frequency-demodulating portion employed in the broadcasting signal receiving apparatus shown in FIG. 1.

FIG. 6 shows an embodiment of pulse counting demodulator constituting the frequency-demodulator 28 employed in the broadcasting signal receiving apparatus shown in FIG. 1.

Referring to FIG. 6, the frequency-modulated intermediate frequency signal SFI2 or the amplitude-modulated intermediate frequency signal SAI2 supplied to an input terminal 151 is subjected to differentiation in a differentiating circuit portion 155 comprising a capacitor 152 and resistors 153 and 154, and subjected also to differentiation in a differentiating circuit portion 160 comprising a capacitor 157 and resistors 158 and 159 after being inverted in polarity by a polarity inverter including an operational amplifier 156.

A differentiated pulse signal Pp obtained from the differentiating circuit portion 155 to include rising pulses and falling pulses appearing alternately is supplied to a base of a transistor 161 of the NPN type and a differentiated pulse signal Pn obtained from the differentiating circuit portion 160 to include rising pulses and falling pulses appearing alternately is supplied to a base of a transistor 162 of the NPN type. A collector of the transistor 161 is connected through a resistor 163 to a current source constituted with a transistor 165 of the PNP type connected to a DC voltage source 164 for supplying with the DC voltage V0 (for example, 2v) and a collector of the transistor 162 is connected through a resistor 166 to a current source constituted with a transistor 167 of the PNP type connected to the DC voltage source 164. The transistor 161 is turned off by each of the falling pulses included in the differentiated pulse signal Pp obtained from the differentiating circuit portion 155 and put in the OFF state in a duration of each of the falling pulses. Similarly, the transistor 162 is turned off by each of the falling pulses included in the differentiated pulse signal Pn obtained from the differentiating circuit portion 160 and put in the OFF state in a duration of each of the falling pulses.

In a period in which the transistor 161 is put in the OFF state, a transistor 168 of the NPN type having its base and emitter connected respectively with the collector and emitter of the transistor 161 is put in the ON state, and in a period in which the transistor 162 is put in the off state, a transistor 169 of the NPN type having its base and emitter connected respectively with the collector and emitter of the transistor 162 is put in the ON state. A collector of the transistor 168 and a collector of the transistor 169 are connected with each other and further connected with a capacitor 170, so that charge stored in the capacitor 170 is discharged through a collector-emitter path of the transistor 168 or a collector-emitter path of the transistor 169 in each period in which the transistor 168 or the transistor 169 is put in the ON state.

One end of the capacitor 170 is connected also with a base of a transistor 171 of the NPN type and the other end of the capacitor 170 is connected with a collector of a transistor 172 of the NPN type. A collector of the transistor 171 is connected with a current source constituted by a transistor 173 of the PNP type connected to the DC voltage source 164 and the collector of the transistor 172 is connected with a current source constituted by a transistor 174 of the PNP type connected to the DC voltage source 164. The transistors 171 and 172 constitute a monostable multivibrator (M.M.).

The falling pulse is supplied as a trigger pulse to the base of the transistor 171 to turn the transistor 171 off whenever the transistor 168 or the transistor 169 is turned on. Accordingly, a circuit portion including the transistors 161, 162, 168 and 169 constitutes a trigger signal generator for producing the trigger signal based on the differentiated pulse signals Pp and Pn to be supplied to the monostable multivibrator comprising the transistors 171 and 172.

When the transistor 171 in the monostable multivibrator comprising the transistors 171 and 172 is turned off, the transistor 172 having its base connected through a resistor 175 to the collector of the transistor 172 is turned on, so that a charging current flows through a collector-emitter path of the transistor 172 into the capacitor 170 to charge the same. The charging current thus flowing into the capacitor 170 is formed with a variable current Ig derived from a transistor 176 of the PNP type having its collector connected with the capacitor 170.

When the charge in the capacitor 170 increases and a voltage potential at the base of the transistor 171 reaches a predetermined value, the transistor 171 is turned on and thereby the transistor 172 is turned off and the monostable multivibrator is put in a stable state up to a time point at which the next falling pulse is supplied as the trigger pulse to the base of the transistor 171. Then, the above mentioned operation is repeated when the next falling pulse is supplied to the base of the transistor 171. As a result, a pulse-train signal PO corresponding to the frequency-modulated intermediate frequency signal SFI2 or the amplitude-modulated intermediate frequency signal SAI2 supplied to the input terminal 151 is obtained at the collector of the transistor 171.

A duration of each pulse forming the pulse-train signal PO obtained at the collector of the transistor 171 is determined by the charging current flowing into the capacitor 170, namely, the variable current Ig derived from the transistor 176 and capacitance of the capacitor 170, and therefore adjusted in accordance with variations in the variable current Ig.

A transistor 179 of the PNP type having its emitter connected to the DC voltage source 164 and its collector and base connected with each other and further connected with a current source 178 constitutes a current mirror portion together with each of the transistors 165, 167, 173 and 174.

The pulse-train signal PO obtained at the collector of the transistor 171 constituting the monostable multivibrator is supplied through a resistor 180 to a base of a transistor 181 of the NPN type and thereby the transistor 181 performs a switching operation in response to each pulse forming the pulse-train signal PO. Transistors 182 and 183 of the NPN type constituting a current mirror portion are connected with a collector of the transistor 181, and transistors 184, 185 and 186 of the PNP type constituting a current mirror portion and a current source 187 are connected with collectors of the transistors 182 and 183.

When the transistor 181 performs the switching operation in response to each pulse forming the pulse-train signal PO, the transistors 182 and 183 constituting the current mirror portion is alternately turned on and off repeatedly and thereby a pulse current IPO is derived from the collector of the transistor 185, with which the collector of the transistor 183 is connected, to be supplied to a current to voltage convertor (current/voltage convertor) 188. A circuit portion including the resistor 180, the transistors 181 to 186 and the current source 187 constitutes a pulse current generating portion for producing the pulse current IPO corresponding to the pulse-train signal PO obtained at the collector of the transistor 171 constituting the monostable multivibrator and supplying the current to voltage convertor 188 with the pulse current IPO.

The pulse current IPO corresponds to the frequency-modulated intermediate frequency signal SFI2 or the amplitude-modulated intermediate frequency signal SAI2 supplied to the input terminal 151.

The current to voltage convertor 188 comprises an operation amplifier 190. The constant DC voltage V2 (for example, 1.25V) is supplied from a DC voltage source 191 to a positive input terminal of the operation amplifier 190 and a circuit portion including capacitor 192 into which the pulse current IPO flows, resistors 193 and 194 and a capacitor 195 are connected between a negative input terminal and the positive input terminal of the operation amplifier 190. In the current to voltage convertor 188 thus constituted, a current to voltage conversion in which the pulse current IPO flowing into the capacitor 192 is integrated to be converted into a voltage is carried out and an output voltage signal corresponding to the pulse current IPO is derived from an output terminal 196 of the current to voltage convertor 188 as the demodulation output signal SOF based on the frequency-modulated intermediate frequency signal SFI2 or the carrier signal component of the amplitude-modulated intermediate frequency signal SAI2.

In such an embodiment of a pulse counting demodulator constituting the frequency-demodulator 28 as shown in FIG. 6, the current to voltage convertor 188 constitutes, together with the pulse current generating portion comprising the resistor 180, the transistors 181 to 186 and the current source 187, an output portion for obtaining the demodulation output signal SOF on the basis of the pulse-train signal PO.

Further, in the embodiment of the pulse counting demodulator constituting the frequency-demodulator 28 shown in FIG. 6, a variable current source portion including the transistor 176 which produces the variable current Ig forming the charging current flowing into the capacitor 170 is provided. In such a variable current source portion, two transistors 200 and 201 of the NPN type having respective emitters connected with each other to form a differential pair are provided, and a current source portion comprising transistors 206 and 207 of the NPN type and resistor 208 is connected with the emitters of the transistors 200 and 201 connected with each other. A current flowing through a transistor 203 of the PNP type which constitutes a current mirror portion together with transistors 202 and 204 of the PNP type is supplied to the current source portion comprising the transistors 206 and 207 and the resistor 208.

A current source portion comprising transistors 209 and 210 of the NPN type and resistor 211 is connected with a collector of the transistors 200 and a current flowing through the transistor 204 is supplied to the current source portion comprising transistors 209 and 210 of the NPN type and resistor 211.

A transistor 212 of the PNP type having its collector and base connected with each other is connected between the collector of the transistor 200 and the DC voltage source 164 and a transistor 213 of the PNP type having its collector and base connected with each other is connected between the collector of the transistor 201 and the DC voltage source 164. The transistor 212 constitutes, together with transistors 215, 216 and 217 of the PNP type, the transistor 176 and a current source 218, a current mirror portion.

The constant DC voltage Vi (for example, 1.65V) is supplied from a DC voltage source 219 to a base of the transistor 201 and a control signal terminal 220, to which the control voltage signal VFA and the control voltage signal VX are supplied from the signal adder 29 employed in the broadcasting signal receiving apparatus shown in FIG. 1, is connected with a base of the transistor 200.

In the variable current source portion thus constituted, when current I1 and current I2 flow through a collector-emitter path of the transistor 200 and a collector-emitter path of the transistor 201, respectively, a constant current I3 corresponding to the sum of the current I1 and the current I2 (I3=I1+I2) flows through the current source portion comprising transistors 206 and 207 and resistor 208. Assuming that I4 represents a constant current flowing through the current source portion comprising transistors 209 and 210 and resistor 211, a current I5 flowing through the transistor 212 corresponds to the sum of the current I1 and the current I4 (I5=I1−I4).

Assuming that a ratio of the current I5 flowing through the transistor 212 to the variable current Ig flowing through the transistor 176 is represented as 1:n (n is constant), the variable current Ig flowing through the transistor 176 is represented with the following equation. Ig=I5/n=(I1+I4)/n.

Under such a condition, when the control voltage signal VX supplied to the control signal terminal 220, in addition to the control voltage signal VFA, is varied, a voltage potential at the base of the transistor 200 is varied. The base of the transistor 201 is supplied with the constant DC voltage V1 and therefore a voltage potential at the base of the transistor 201 is kept constant and therefore a ratio of the current I2 flowing through the collector-emitter path of the transistor 201 to the current I1 flowing through the collector-emitter path of the transistor 200 is varied. Since the sum of the current I1 and the current I2 is maintained to be constant (the current I3), the current I1 is varied in response to variations in the control voltage signal VX.

At this time, the current I4 flowing through the current source portion comprising transistors 209 and 210 and resistor 211 does not vary and therefore the variable current Ig (Ig=(I1+I4)/n) flowing through the transistor 176 is varied in response to variations in the current I1. As a result, when the control voltage signal VX is varied, the variable current Ig supplied from the transistor 176 to form the charging current flowing into the capacitor 170 is varied.

Assuming that a represents the ratio of the current I2 flowing through the collector-emitter path of the transistor 201 to the current I flowing through the collector-emitter path of the transistor 200, Vbe represents a voltage between the base and the emitter of each of the transistors 207 and 210, R8 represents resistance of the resistor 208, and R10 represents resistance of the resistor 210, the following equations are satisfied in connection with the currents I1, I2, I3, I4, I5 and Ig.

$$I1 = I2/a = (I3 - I1)/a = I3/(1 + a)$$

$$I3 = Vbe/R8$$

$$I4 = Vbe/R10$$

$$Ig = (I1 + I4)/n = (I3/(1 + a) + I4)/n$$
$$= ((Vbe/R8)/(1 + a) + Vbe/R10)/n$$

Accordingly, variations in the variable current Ig in response to variations in the ratio a of the current I2 to the current I1 are brought about in accordance with the above mentioned equations.

What is claimed is:

1. A pulse counting demodulator comprising;

input differentiating means for differentiating an input frequency-modulated signal to produce a differentiated pulse signal based on the input frequency-modulated signal, monostable multivibrator means including a capacitive element for conducting an output level inverting operation by charging and discharging said capacitive element in response to a trigger signal supplied to said monostable multivibrator means in response to the differentiated pulse signal obtained from said input differentiating means, variable current source means for supplying said capacitive element with a charging current and varying the charging current in response to an externally supplied control voltage, and output means for obtaining a demodulation output signal having a level corresponding to the output level inverting operation in said monostable multivibrator means.

2. The pulse counting demodulator according to claim 1 further comprising trigger signal generating means for producing a pulse signal based on the differentiated pulse signal obtained from said input differentiating means and supplying said monostable multivibrator means with said pulse signal as the trigger signal.

3. The pulse counting demodulator according to claim 1, wherein said output means comprises pulse current generating means for providing a pulse current corresponding to the output level inverting operation in said monostable multivibrator means and current to voltage converting means for producing a voltage signal in response to the pulse current obtained from said pulse current generating means for forming the demodulation output signal.

4. The pulse counting demodulator according to claim 1, wherein said variable current source means comprises constant current source means for producing a substantially constant current, variable current source means for producing a current variable in response to an externally supplied control voltage, and current supplying means for supplying said capacitive element with the charging current corresponding to a sum of said substantially constant current and said variable current.

5. The pulse counting demodulator according to claim 2, wherein said input differentiating means, said trigger signal generating means, said monostable multivibrator means, said variable current source means and said output means are incorporated into an integrated circuit device and wherein a control voltage terminal through which said control voltage is supplied to said variable current source means is provided on said integrated circuit device.

* * * * *